(12) United States Patent
Patterson

(10) Patent No.: US 8,394,244 B1
(45) Date of Patent: Mar. 12, 2013

(54) SYSTEM AND METHOD FOR LASER PATTERNING AN INTEGRATED CIRCUIT ETCHING MASK

(75) Inventor: Joseph Martin Patterson, Carlsbad, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 696 days.

(21) Appl. No.: 12/566,600

(22) Filed: Sep. 24, 2009

(51) Int. Cl.
*C23C 14/00* (2006.01)
*C23C 14/32* (2006.01)
*G01R 31/26* (2006.01)
*H01L 21/66* (2006.01)
*H01L 21/00* (2006.01)

(52) U.S. Cl. .......... 204/192.34; 438/15; 438/4; 438/106

(58) Field of Classification Search .................. None
See application file for complete search history.

(56) References Cited

U.S. PATENT DOCUMENTS 4,946,549 A * 8/1990 Bachman et al. ............... 216/69
2008/0171448 A1* 7/2008 Patterson ...................... 438/798

* cited by examiner

*Primary Examiner* — Emily Le
*Assistant Examiner* — Jenny Wu
(74) *Attorney, Agent, or Firm* — Turocy & Watson, LLP

(57) ABSTRACT

A method is provided for laser patterning an integrated circuit (IC) etching mask. The method provides an IC packaged die with a first region underlying a backside surface of a bulk silicon (Si) layer. An etch-resistant film is formed overlying the backside surface. Alternately, the entire IC die package is conformally coated. A semi-transparent film is formed overlying the etch-resistant film, semi-transparent to light having a first wavelength. In response to irradiating the semi-transparent film with light having a first power density, an IC die first region is located. In response to irradiating the semi-transparent film with a laser light having a second power density, greater than the first power density, an area of etch-resistant film overlying the first region is decomposed. More explicitly, an area of semi-transparent film overlying the first region is ablated, and the etch-resistant film underlying the ablated semi-transparent film is heated.

16 Claims, 5 Drawing Sheets

SYSTEM AND METHOD FOR LASER PATTERNING AN INTEGRATED CIRCUIT ETCHING MASK

BACKGROUND OF THE INVENTION

1. Field of the Invention

This invention generally relates to integrated circuits (ICs) and, more particularly, to a post-production method for patterning an IC etch mask, to support the selective etching of packaged and unpackaged. IC die for investigation or repair.

2. Description of the Related Art

IC production facilities are established so that thousands of fragile parts can be safely processed in a short amount of time, with little human intervention. IC dice are parallel processed on a wafer, and each die may include thousands, or even millions of electrical components, such as transistors and resistors, distributed over multiple interconnected layers. Typically, an IC die is tested after fabrication, and many "internal" test points are exposed at this point in the process. After attachment to an IC package, for example using an epoxy adhesive, only the package external interfaces, or pins are accessible.

While it is rarely cost effective to repair an IC die after it has been assembled into a package, there are many circumstances where it desirable to reverse engineer, perform fault analysis, or access an internal test point to monitor performance under realistic load conditions. Typically, it is easier to access the backside of the IC, which is the first layer of IC die circuitry. Therefore, it is necessary to remove a region of the bulk silicon (Si) wafer upon which the IC has been fabricated. Depending on the package style, the package or part of the package may be removed to access the bulk Si wafer.

Once the region of interest is exposed, a "picoprobe", which is a probe with a field effect transistor (FET) input and very fine tip, can be used to measure electrical signals. Alternately, temperature measurements can be made, or a photon emission microscope (PEM) may be used to measure light being emitted from operating transistors. Further, a scanning electron-beam microscope (SEM) may be used to measure electron flow.

However, it is difficult to precisely locate a window through the bulk Si to the backside of the IC die. It is also difficult to efficient make such a window, without damaging the IC die, in a time effective manner. Although laser and chemical etching processes may be used to form openings in thin-film passivation layers, generally a focused ion beam (FIB) is the tool of choice for etching through the relatively thick bulk Si layer.

FIB systems have a fine resolution, better than 0.1 microns, and can forms holes with an aspect ratio of up to 18:1. A FIB is similar to a scanning electron microscope, but uses to focused beam of gallium ions instead of electrons. The ions are accelerated to an energy of up to 50 keV, and focused with an electrostatic lenses. A FIB can deliver tens of nanoamps of current to a selected region, or can image die region with a spot size on the order of a few nanometers.

The FIB ions are inherently destructive, as they sputter atoms from the surface they strike. As a result, the FIB can be used as a micro-machining tool, to etch features at as very fine scale. Further. FIB can be used to deposit material via ion beam induced deposition of FIB-assisted chemical vapor deposition (CVD). Thus, FIB is used to modify an existing IC, remove electrical connections, or deposit a conductive metal.

To form a window through the bulk Si wafer to the backside of the IC die, the bulk Si wafer is initially thinned using a polishing process. Then, it is typically necessary to use the FIB to form three of four alignment holes to find alignment markings. Once the alignment is known, a window can be sputtered to the desired die region. Alternately, the FIB may be accessorized with a con-focal laser to perform the alignment. However, these instruments are very expensive and the etching must be performed one window at a time, which is slow and costly. The selective removal of the bulk silicon on the back of the die is also needed to support other failure analysis techniques such as light emission, thermally induced voltage alteration (TIVA), infrared (IR) imaging, laser voltage probing, picosecond (PICA), and others.

One solution to this problem was presented in U.S. Pat. No. 7,402,469, invented by Joseph Patterson. This method initially irradiates the bulk Si layer to locate an IC die region. In response to irradiating an overlying semi-transparent film with a greater power density, a region of the semi-transparent film is marked. An etch-dam is created around the marked region, so that the bulk Si layer can be selectively etched. Unfortunately, this method requires the application of different materials in separate process steps. Further, the selective etching is a manual process requiring dexterity, which often reduces alignment accuracy.

It would be advantageous if a method existed for forming windows through a Si wafer, to an IC die, that was faster and more efficient than the above-described processes.

SUMMARY OF THE INVENTION

Described herein, is a relatively simple process to form a patterned etch-chemical resistant mask on the hack of a die. An etch resistance material, such as poly-para-xylylene is deposited, for example using a chemical vapor deposition (CVD) process, as a thin uniform layer on the die. A semi transparent material, such as polyimide tape is placed over the poly-para-xylylene layer. A laser may be used at low power to locate the site of interest by looking through the tape, poly-para-xylylene, and hulk silicon. When the site is located, the laser power is increased and the focus is adjusted to the polyimide tape layer. The laser is used to ablate the polyimide tape by heating it, and at the same time the heat is transferred to the poly-para-xylylene layer causing it to decompose. Note that the poly-para-xylylene is transparent to a 1350 nm wavelength laser, and is not heated directly. The polyimide tape may then removed, and the decomposed poly-para-xylylene with it, in the exposed area. The sample is then ready for selective silicon etching.

Poly-para-xylylene is transparent to an infrared laser (wavelength 1340 nanometers), which may be used for imaging and ablation. Poly-para-xylylene adheres well to silicon, and is highly resistant to the chemicals used to etch silicon. Further, it is easy to apply, and is compatible with the other materials and steps used in the process. Additionally, poly-para-xylylene has an index of refraction of 1.6, which is greater than air and glass, so it is a good optical matching interface for the silicon, which has a much higher index of refraction. Therefore, optical image resolution through the silicon is increased.

Accordingly, a method is provided for laser patterning an integrated circuit (IC) etching mask. The method provides an IC packaged the with a first region underlying a backside surface of a bulk silicon (Si) layer. An etch-resistant film is formed overlying the backside surface. Alternately, the entire IC die package is conformally coated. A semi-transparent film is formed overlying the etch-resistant film, semi-transparent to light having a first wavelength. In response to irradiating the semi-transparent film with light having a first power density, an IC die first region is located. In response to irradiating the semi-transparent film with a laser light having a second power density, greater than the first power density, an area of etch-resistant film overlying the first region is decomposed. More explicitly, an area of semi-transparent film overlying the first region is ablated, and the etch-resistant film underlying the ablated semi-transparent film is heated.

In one aspect, the backside surface overlying the IC the first region is selectively etched, so that the IC die first region is exposed. In another aspect, an etchant is used to selectively thin a backside surface area overlying the IC die first region. Then, the thinned backside surface area is sputtered with as focused ion beam (FIB), and in response to the FIB, the IC die first region is exposed.

Additional details of the above-described method, a method for exposing a packaged IC die region, and a method for selectively etching a packaged or unpackaged. IC die region, are described below.

DETAILED DESCRIPTION

Figure 1:
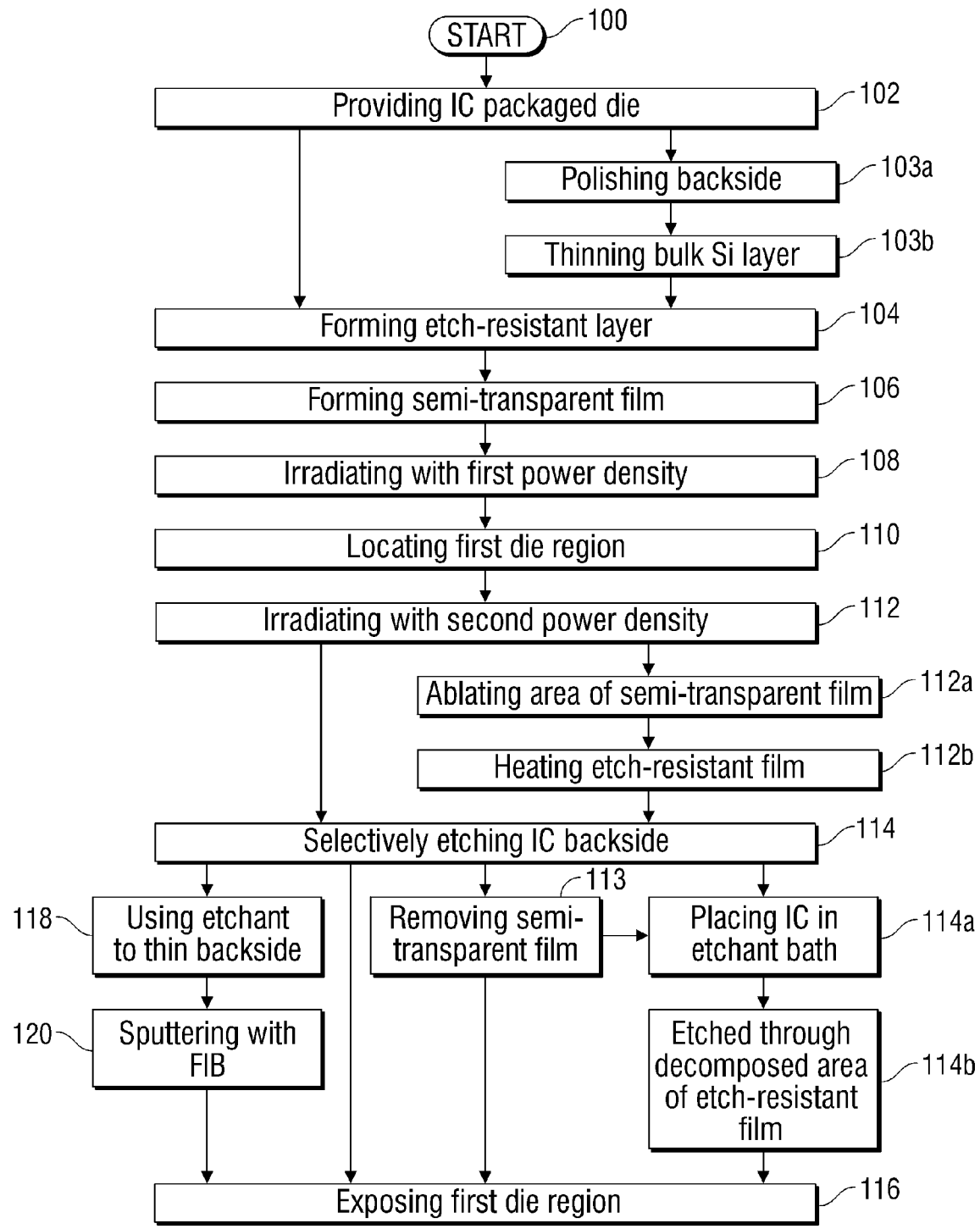
FIG. 1 is a flowchart illustrating a method for laser patterning an integrated circuit (IC) etching mask.

FIG. 1 is a flowchart illustrating a method for laser patterning an integrated circuit (IC) etching mask. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 100.

Step 102 provides an IC packaged die with a first region underlying a backside surface of a bulk silicon (Si) layer. Step 104 forms an etch-resistant film overlying the backside surface. In one aspect, the etch-resistant film is poly-para-xylylene (e.g., Parylene™). However, other conventional materials can be used to enable the method. These materials should have the qualities of being resistant to the etchant and being substantially transparent at the light wavelengths being used. Step 106 forms a semi-transparent film overlying the etch-resistant film, semi-transparent to light having a first wavelength. For example, the semi-transparent film may be a polyimide (e.g. Kapton™) or a polyethylene terephthalate (boPET) polyester (e.g. Mylar™) film. Again, other conventional materials may also be used to support the method. One requirement of the semi-transparent film is that it has enough attenuation in the range of light wavelengths being used that it can be ablated with sufficient laser fluence.

Step 108 irradiates the semi-transparent film with light having the first wavelength. In response to irradiating the semi-transparent film with a first power density, Step 110 locates the IC die first region. In response to irradiating the semi-transparent film with a laser light having a second power density, greater than the first power density, Step 112 decomposes an area of etch-resistant film overlying the first region. In one aspect, decomposing the area of the etch-resistant film in Step 112 includes substeps. Step 112a ablates an area of semi-transparent film overlying the first region. Step 112b heats the etch-resistant film underlying the ablated semi-transparent film.

In one aspect, irradiating the semi-transparent film with the laser light (Step 110) includes irradiating with light having a first wavelength of greater than about 1 micron and less than about 2 microns. There is no requirement that the same laser be used in Steps 108 and 110, or even that the same wavelength be used, but the method is simplified if the same light source can be used for both steps. Silicon is transparent to wavelengths of light greater than 1.1 microns, but opaque to visible light. Typically, the laser light source is equipped with a laser scanning microscope (LSM). The reflected laser light is detected, and as the laser scans the sample areas, the reflected signal is displayed as video on a CRT to form an image. This LSM microscope may cost $50 to 75K, which is only 5 to 10% the cost of an entire FIB system. Failure analysis labs often use an LSM for other unrelated purposes.

In one aspect, Step 114 selectively etches the backside surface overlying the IC die first region, and Step 116 exposes the IC die first region. In another aspect, forming the etch-resistant film in Step 104 includes isotropically depositing the etch-resistant film overlying the entire IC package. Then, selectively etching the backside surface in Step 114 includes substeps. Step 114a places the IC package in an etchant bath, and Step 114b etches the backside surface through the decomposed area of the etchant-resistant film. A wide variety of Si etchants are known in the art that are suitable for this purpose. Optionally, prior to selectively etching the backside surface overlying the IC die first region. Step 113 removes the semi-transparent film.

In one aspect, forming the etch-resistant film in Step 104 includes forming a film having an index of refraction about midway between of indices of refraction for air and silicon. In a different aspect, Step 104 forms a film having a plano-plano lens shape. Likewise, the semi-transparent film forming in Step 106 may have an index of refraction about midway between of indices of refraction for air and silicon. It is best, optically, if the etch-resistance film index is halfway between air and silicon. Further, the etch-resistant film layer is preferably a plano-plano lens, so as to not bend of light rays. Index matching is useful to reduce reflection from the surface. Since there is so much power in the laser and the reflection % is low, reflection is typically not an issue. However, lower reflectivity reduces interference lines, which is an advantage. The index of silicon is 3.4, polyimide is 1.7, poly-para-xylylene is 1.64, and air is 1.00.

In one aspect, prior to forming the semi-transparent film in Step 104, Step 103a polishes the backside surface. In response to the polishing, Step 103b thins the bulk Si layer overlying the IC die first region. For example, a mechanical polishing process can be used to mill the bulk Si down to a thickness of less than 100 microns (e.g., about 50 microns).

In another aspect. Step 118 uses an etchant to selectively thin the backside surface area overlying the IC die first region. Step 120 sputters the thinned backside surface area with a focused ion beam (FIB), and in response to the FIB, Step 116 exposes the IC the first region.

FIGS. 2A through 2F are partial cross-sectional views depicting steps in the processing of a device using the method of FIG. 1. The "chip" part of the flip/chip package refers to the silicon die. Most of the die, about 95+% by volume, is bulk silicon upon which the active circuitry is built. This active circuitry is built on the to surface of the die. In flip/chip package configuration the top of the die is facing and attached to the package. In this case, the package is just a flat piece of printed circuit (PC) board. The back of the die (the bulk silicon) has no package attached to it. Some package types do have a metal heat sink or lid over the back of the die, which is considered part of the package. This lid or heat sink may be removed before the present invention process is started.

The intent of the process is to selectively remove all of the bulk silicon (starting at the back) at a localized site to access the thin layer of active circuitry on the die frontside through the backside.

Although a flip/chip die and package are used as an example, many other die and package types are known in the art. While some of these other package styles may require some handling steps other than those specifically described herein, once the bulk Si covering the desired IC die site is exposed, the process is essentially the same for all die and package styles.

Figure 2A:
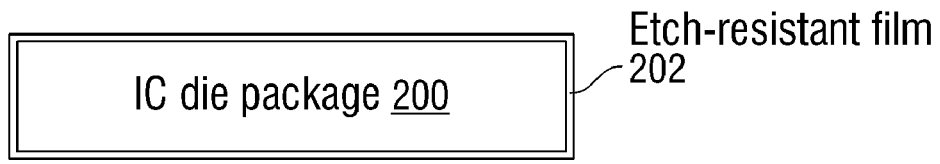
FIGS. 2A through 2F are partial cross-sectional views depicting steps in the processing of a device using the method of FIG. 1.

In FIG. 2A, an IC die package 200 is conformally coated with an etch-resistance film 202.

Figure 2B:
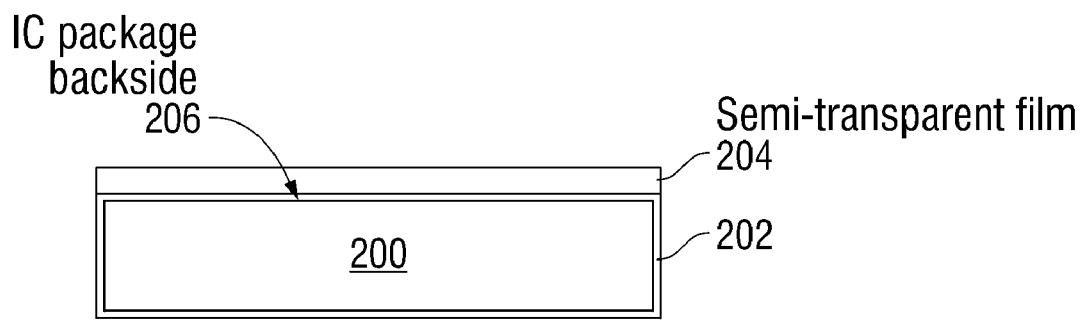

In FIG. 2B, a semi-transparent film 204 is formed over the IC the package backside 206.

Figure 2C:
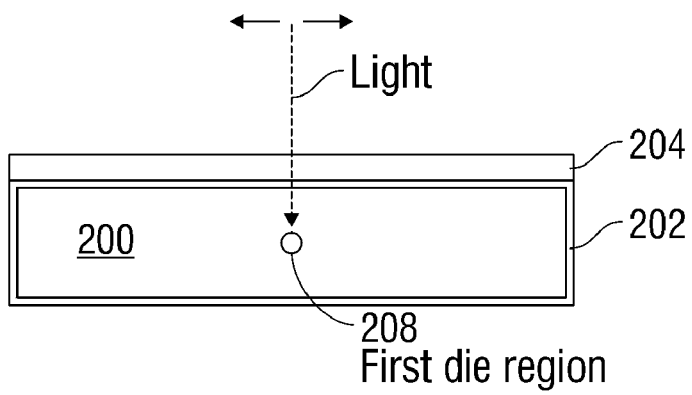

In FIG. 2C, light at a wavelength transparent to Si is used to locate the first die region 208.

Figure 2D:
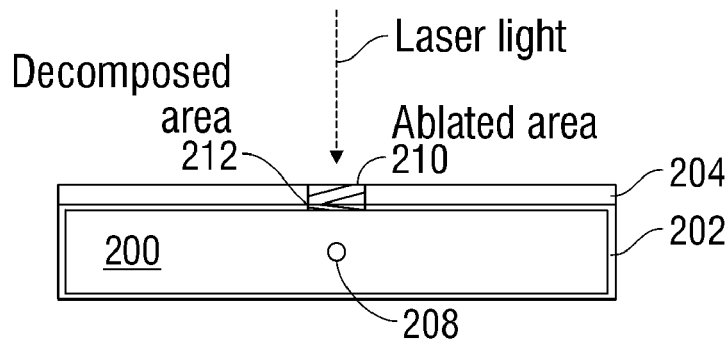

In FIG. 2D, laser light with a fluence greater than that used in FIG. 2C is used to ablate an area 210 of the semi-transparent film overlying the located first die region 208. The ablated area 210 causes an underlying area 212 of the etch-resistant film 202 to decompose.

Figure 2E:
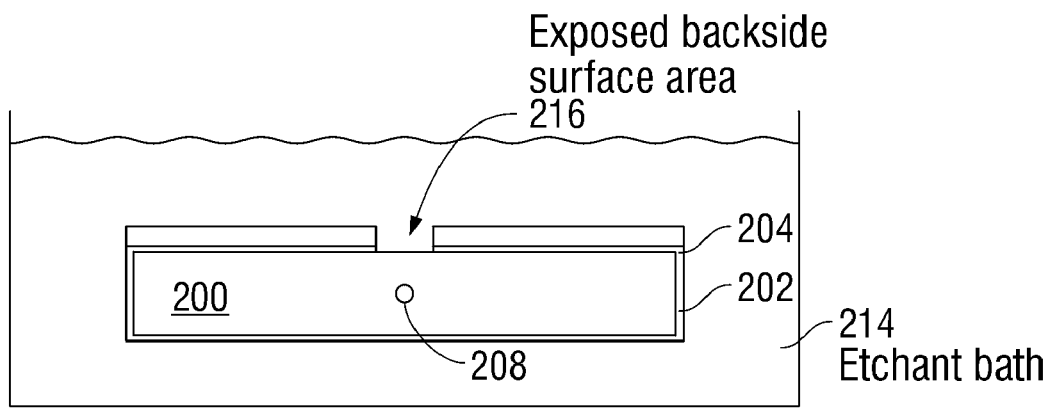

In FIG. 2E, the IC is bathed in an etchant 214. The IC backside surface area 216 exposed to the etchant 214 is removed.

Figure 2F:
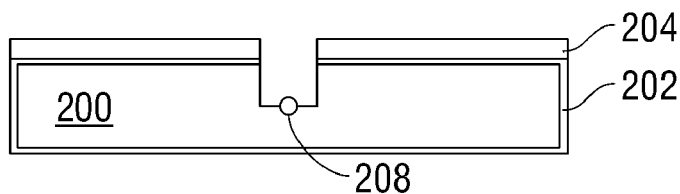

In FIG. 2F, the first die region 208 is exposed as a result of the selective etching.

Figure 3:
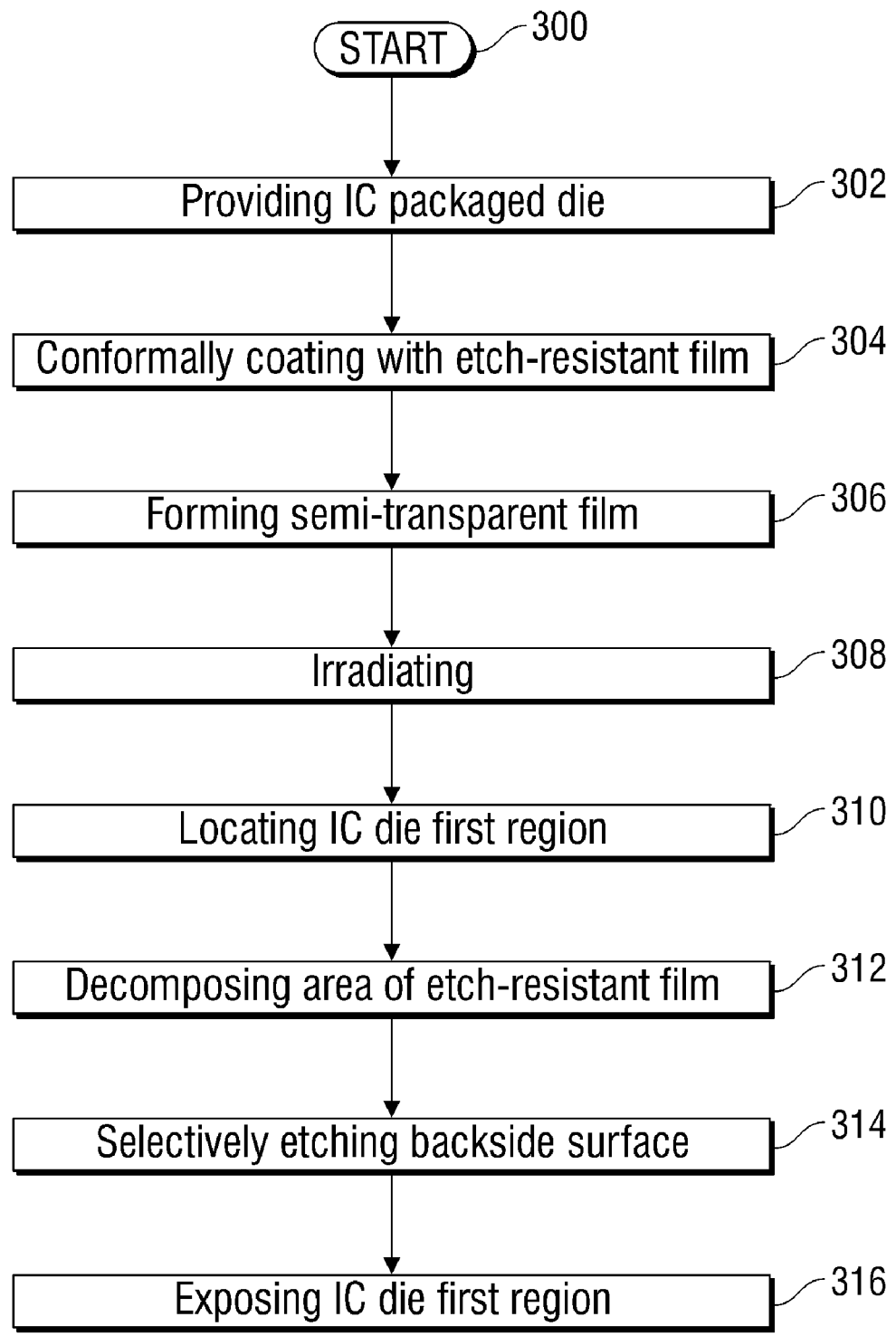
FIG. 3 is a flowchart illustrating a method for exposing a packaged IC die region.

FIG. 3 is a flowchart illustrating a method for exposing a packaged IC die region. The method starts at Step 300. Step 302 provides an IC packaged die with a first region underlying a backside surface of a bulk Si layer. Step 304 conformally coats the IC die package with an etch-resistant film. Step 306 forms a semi-transparent film overlying the etch-resistant film on the backside surface. The film is semi-transparent to light having a first wavelength. Step 308 irradiates the semi-transparent film with light having the first wavelength. In response to irradiating the semi-transparent film with a first power density, Step 310 locates the IC die first region. In response to irradiating the semi-transparent film with a laser light having a second power density, greater than the first power density, Step 312 decomposes an area of etch-resistant film overlying the first region. Step 314 selectively etches the backside surface overlying the IC die first region, and Step 316 exposes the IC die first region.

Figure 4:
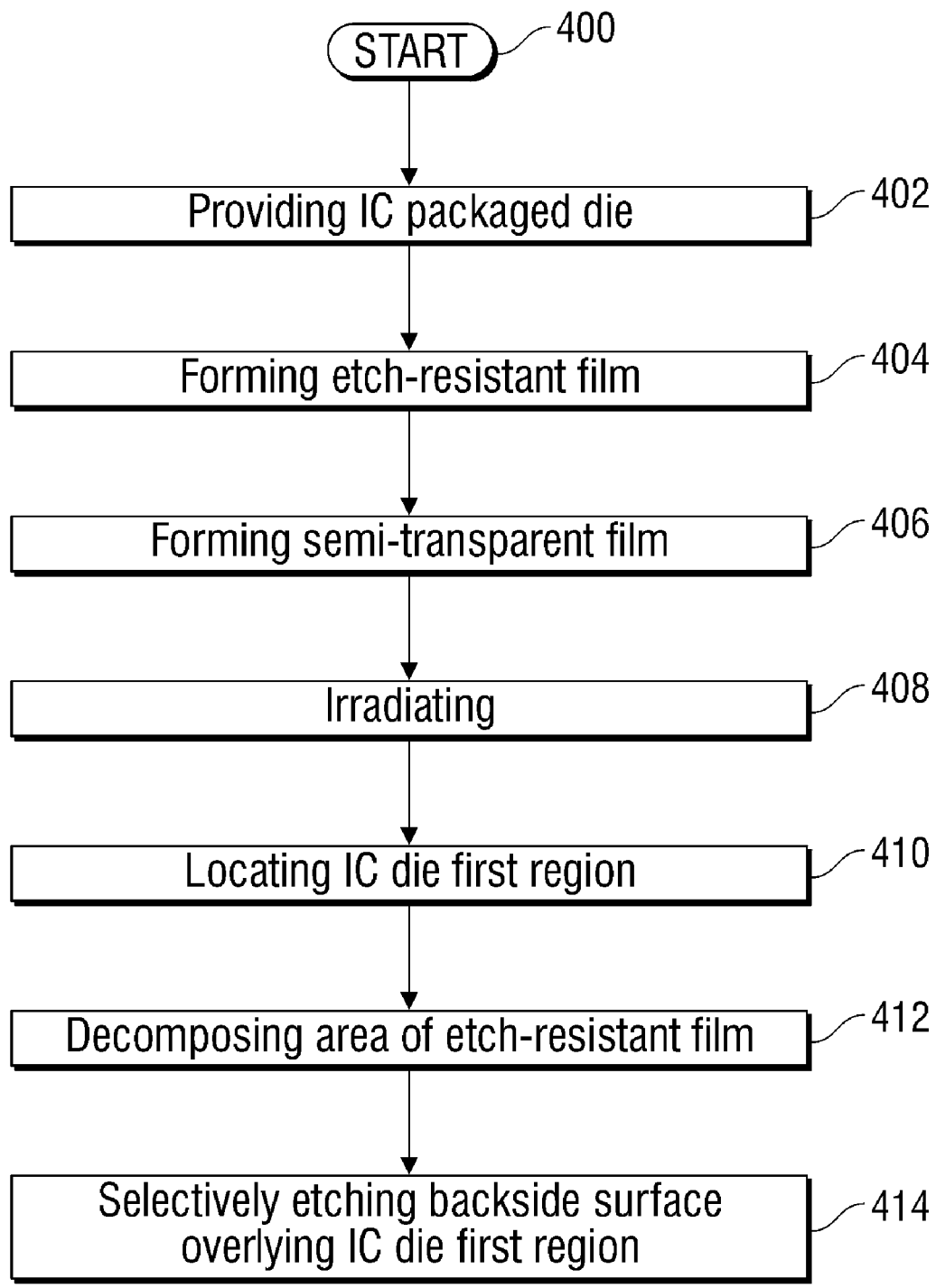
FIG. 4 is a flowchart illustrating a method for selectively etching a packaged IC die region.

FIG. 4 is a flowchart illustrating a method for selectively etching a packaged IC die region. The method starts at Step 400. Step 402 provides an IC packaged die with a first region underlying a backside surface of a bulk Si layer. Step 404 forms an etch-resistant film overlying the backside surface. Step 406 forms a semi-transparent film overlying the etch-resistant film, semi-transparent to light having a first wavelength. Step 408 irradiates the semi-transparent film with light having the first wavelength. In response to irradiating the semi-transparent film with a first power density, Step 410 locates the IC die first region. In response to irradiating the semi-transparent film with a laser light having a second power density, greater than the first power density, Step 412 decomposes an area of etch-resistant film overlying the first region. Step 414 selectively etches a backside surface area overlying the IC die first region.

A method has been provided for patterning an etch resistance mask, for the purpose of selectively etching an IC die package and accessing regions of the die. Specific materials, package styles, and process details have been given to illustrate the invention. However, the invention is not limited to merely these examples. Other variations and embodiments of the invention will, occur to those skilled in the art.

I claim:

1. A method for laser patterning an integrated circuit (IC) etching mask, the method comprising:
   providing an IC packaged die with a first region underlying a backside surface of a bulk silicon (Si) layer;
   forming an etch-resistant film overlying the backside surface;
   forming a semi-transparent film overlying the etch-resistant film, semi-transparent to light having a first wavelength;
   irradiating the semi-transparent film with light having the first wavelength;
   in response to irradiating the semi-transparent film with a first power density, locating the IC die first region; and,
   in response to irradiating the semi-transparent film with a laser light having a second power density, greater than the first power density, decomposing an area of etch-resistant film overlying the first region.

2. The method of claim 1 further comprising:
   selectively etching the backside surface overlying the IC die first region; and,
   exposing the IC die first region.

3. The method of claim 1 wherein irradiating the semi-transparent film with the laser light includes irradiating with light having a first wavelength of greater than 1 micron and less than 2 microns.

4. The method of claim 1 wherein forming the semi-transparent film includes forming a film selected from a group consisting of polyimide and polyethylene terephthalate (bo-PET) polyester films.

5. The method of claim 1 wherein forming the etch-resistant film includes forming a poly-para-xylylene film.

6. The method of claim 5 wherein decomposing the area of the etch-resistant film includes:
   ablating an area of semi-transparent film overlying the first region; and,
   heating the etch-resistant film underlying the ablated semi-transparent film.

7. The method of claim 2 wherein forming the etch-resistant film includes isotropically depositing the etch-resistant film overlying the entire IC package.

8. The method of claim 7 wherein selectively etching the backside surface includes:
   placing the IC package in an etchant bath; and,
   etching the backside surface through the decomposed area of the etchant-resistant film.

9. The method of claim 1 wherein forming the etch-resistant film includes forming a film having an index of refraction about midway between of indices of refraction for air and silicon.

10. The method of claim 1 wherein forming the etch-resistant film includes forming a film having a plano-plano lens shape.

11. The method of claim 1 further comprising:
    prior to forming the semi-transparent film, polishing the backside surface; and,
    in response to the polishing, thinning the bulk Si layer overlying the IC die first region.

12. The method of claim 1 further comprising:
    using an etchant, selectively thinning a backside surface area overlying the IC die first region; and, sputtering the thinned backside surface area with a focused ion beam (FIB); and, in response to the FIB, exposing the IC die first region.

13. The method of claim 1 wherein forming the semi-transparent film includes forming a film having an index of refraction about midway between of indices of refraction for air and silicon.

14. The method of claim 2 further comprising:

prior to selectively etching the backside surface overlying the IC die first region, removing the semi-transparent film.

15. A method for exposing a packaged integrated circuit (IC) die region, the method comprising:

providing an IC packaged the with a first region underlying a backside surface of a bulk silicon (Si) layer;

conformally coating the IC die package with an etch-resistant film;

forming a semi-transparent film overlying the etch-resistant film on the backside surface, semi-transparent to light having a first wavelength;

irradiating the semi-transparent film with light having the first wavelength;

in response to irradiating the semi-transparent film with a first power density, locating the IC die first region;

in response to irradiating the semi-transparent film with a laser light having a second power density, greater than the first power density, decomposing an area of etch-resistant film overlying the first region;

selectively etching the backside surface overlying the IC die first region; and, exposing the IC die first region.

16. A method for selectively etching a packaged integrated circuit (IC) die region, the method comprising:

providing an IC packaged die with a first region underlying a backside surface of a bulk silicon (Si) layer;

forming an etch-resistant film overlying the backside surface;

forming a semi-transparent film overlying the etch-resistant film, semi-transparent to light having a first wavelength;

irradiating the semi-transparent film with light having the first wavelength;

in response to irradiating the semi-transparent film with a first power density, locating the IC die first region;

in response to irradiating the semi-transparent film with a laser light having a second power density, greater than the first power density, decomposing an area of etch-resistant film overlying the first region; and, selectively etching a backside surface area overlying the IC die first region.

* * * * *